(12) United States Patent
Lee et al.

(10) Patent No.: US 11,191,150 B2
(45) Date of Patent: Nov. 30, 2021

(54) ELECTRONIC COMPONENT MODULE AND METHOD FOR MANUFACTURING THE SAME

(71) Applicant: Samsung Electro-Mechanics Co., Ltd., Suwon-si (KR)

(72) Inventors: Hong Seok Lee, Suwon-si (KR); Gye Won Lee, Suwon-si (KR); Hee Sun Oh, Suwon-si (KR); Jong Yun Kim, Suwon-si (KR); Seung Pil Jung, Suwon-si (KR); Chang Ju Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/729,661

(22) Filed: Dec. 30, 2019

(65) Prior Publication Data

US 2021/0045225 A1    Feb. 11, 2021

(30) Foreign Application Priority Data

Aug. 9, 2019    (KR) .......................... 10-2019-0097705

(51) Int. Cl.
*H05K 1/02*    (2006.01)
*H05K 3/34*    (2006.01)
(Continued)

(52) U.S. Cl.
CPC .............. *H05K 1/021* (2013.01); *H05K 3/284* (2013.01); *H05K 3/341* (2013.01); *H05K 3/462* (2013.01);
(Continued)

(58) Field of Classification Search
CPC ....... H01L 2924/00012; H01L 2924/00; H01L 2224/32225; H01L 2224/73204;
(Continued)

(56) References Cited

U.S. PATENT DOCUMENTS 5,291,062 A * 3/1994 Higgins, III ............ H01L 23/04
257/693
6,861,750 B2 3/2005 Zhao et al.
(Continued)

FOREIGN PATENT DOCUMENTS

JP        2005-5629 A    1/2005
JP    2013-538012 A    10/2013
(Continued)

OTHER PUBLICATIONS

Korean Office Action dated Aug. 18, 2020 in the corresponding Korean Patent Application No. 10-2019-0097705 (10 pages in English and 7 pages in Korean).
Korean Office Action dated Feb. 3, 2021 in counterpart Korean Patent Application No. 10-2019-0097705 (9 pages in English, 6 pages in Korean).

*Primary Examiner* — Mandeep S Buttar
(74) *Attorney, Agent, or Firm* — NSIP Law

(57) ABSTRACT

An electronic component module includes a first board comprising a component insertion portion, at least one heat-generating component mounted on a first surface of the first board and in which at least a portion of an active surface is exposed through the component insertion portion, a radiating component inserted into the component insertion portion and mounted on the active surface of the heat-generating component, a second board mounted on a second surface of the first board and configured to electrically connect the first board to an external source, and a connection conductor disposed on an inactive surface of the radiating component and configured to allow contact between the inactive surface of the radiating component and a main board.

16 Claims, 4 Drawing Sheets

(51) Int. Cl.
*H05K 3/28* (2006.01)
*H05K 3/46* (2006.01)

(52) U.S. Cl.
CPC ............... *H05K 2201/1053* (2013.01); *H05K 2201/10416* (2013.01); *H05K 2201/10537* (2013.01); *H05K 2203/1316* (2013.01)

(58) Field of Classification Search
CPC . H01L 2924/00014; H01L 2224/16225; H01L 2924/181; H01L 2924/15311; H01L 24/20; H01L 2224/12105; H01L 23/5389; H01L 23/49816; H01L 2924/19105; H01L 2224/02331; H01L 23/49822; H01L 23/5383; H01L 21/4857; H05K 1/185; H05K 1/021; H05K 1/0203; H05K 1/0204; H05K 1/181; H05K 3/341; H05K 3/4644; H05K 3/4697; H05K 2201/10416; H05K 1/056; H05K 1/141; H05K 2201/042
USPC .................. 361/709, 720, 719, 704, 679.46
See application file for complete search history.

(56) References Cited

U.S. PATENT DOCUMENTS

| | | | | |
|---|---|---|---|---|
| 10,861,764 | B2* | 12/2020 | Viswanathan | ...... H01L 21/4882 |
| 2011/0210444 | A1 | 9/2011 | Jeng et al. | |
| 2013/0127025 | A1* | 5/2013 | Cho | ...................... H01L 23/552 |
| | | | | 257/660 |
| 2014/0217610 | A1* | 8/2014 | Jeng | .................. H01L 23/49827 |
| | | | | 257/774 |
| 2018/0063961 | A1* | 3/2018 | Kim | ..................... H05K 3/4697 |
| 2019/0057924 | A1 | 2/2019 | Kim et al. | |

FOREIGN PATENT DOCUMENTS

| | | |
|---|---|---|
| KR | 10-0352119 B1 | 12/2002 |
| KR | 10-2014-0136812 A | 12/2014 |
| KR | 10-2015-0067803 A | 6/2015 |
| KR | 10-2018-0023384 A | 3/2018 |
| KR | 10-2019-0018812 A | 2/2019 |
| WO | WO 2012/040271 A1 | 3/2012 |

* cited by examiner

ELECTRONIC COMPONENT MODULE AND METHOD FOR MANUFACTURING THE SAME

CROSS-REFERENCE TO RELATED APPLICATION

This application claims the benefit under 35 USC § 119(a) of Korean Patent Application No. 10-2019-0097705 filed on Aug. 9, 2019, in the Korean Intellectual Property Office, the entire disclosure of which is incorporated herein by reference for all purposes.

BACKGROUND

1. Field

The description relates to an electronic component module and a method of manufacturing the electronic component.

2. Description of Related Art

Recently, there has been rapidly increasing demand for portable devices in the electronic products market, and miniaturization and weight reduction of electronic components mounted on the portable devices thereof are becoming more desirable.

To manufacture miniaturized and lightweight electronic components, there has been demand not only for technology the reduces the sizes of individual components mounted thereon, but also for System-on-Chip (SoC) technology that provides a plurality of individual devices in one chip, or System-in-Package (SiP) technology that provides numerous individual devices in a single package.

Additionally, in response to the demand for mobile devices such as cellular phones and tablets to be highly efficient and multi-functionalized, as well as slimmer, there is also a desire that mounted components be miniaturized and slimmer. Accordingly, there is a desire for technology to be implemented that resolves problems associated with the heating of highly efficient electric devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an electronic component module includes a first board comprising a component insertion portion, at least one heat-generating component mounted on a first surface of the first board, a radiating component inserted into the component insertion portion, and mounted on an active surface of the heat-generating component, a second board mounted on a second surface of the first board, and configured to electrically connect the first board to an external source, and a connection conductor disposed on an inactive surface of the radiating component, and configured to allow contact between the inactive surface of the radiating component and a main board.

At least a portion of the active surface of the heat generating component may be exposed through the component insertion portion.

The component insertion portion may be formed in the shape of a through-hole.

The radiating component may be formed of a metal block.

The radiating component may include a component portion in contact with the active surface of the heat-generating component, and a radiating portion bound to an inactive surface of the component portion.

The second board may include a component accommodating portion having a through-hole shape, and the component portion is disposed inside the component accommodating portion.

At least a portion of the radiating component may be disposed inside the component accommodating portion.

A mounting height of the radiating component may be formed to be equal to an overall height of the first board and the second board.

The radiating component may have a cross section that increases in a direction that is transverse to the first board.

The electronic component may further include at least one electronic component mounted on the first surface of the first board, or the second surface of the first board.

The connection conductor may be formed of one of solder and a conductive resin.

The connection conductor may be disposed on the entirety of the inactive surface of the radiating component.

The electronic component module may further include an electronic component inserted into the component insertion portion, and mounted on the active surface of the heat-generating component.

A mounting height of the electronic component may be higher than a thickness of the second board.

In a general aspect, a method of manufacturing an electronic component module includes preparing a first board comprising a component insertion portion, mounting at least one heat-generating component on a first surface of the first board, inserting a radiating component into the component insertion portion, disposing a second board on a second surface of the first board, and disposing a connection conductor on an inactive surface of the radiating component.

The mounting of the at least one heat-generating component may cause at least a portion of an active surface of the heat-generating component to be exposed through the component insertion portion.

The disposing of the second board may include disposing an electronic component on the second surface of the first board.

A sealing portion that seals the heat-generating component may be formed on the first surface of the first board.

Other features and aspects will be apparent from the following detailed description, the drawings, and the claims.

Figure 1:
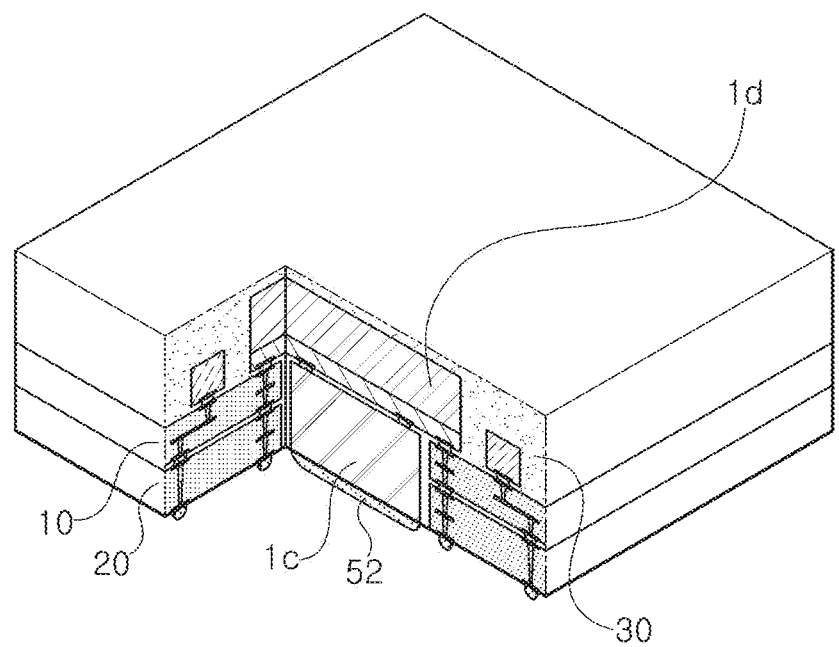
FIG. 1 illustrates a perspective view of a partially cutaway electronic component module, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Figure 2:
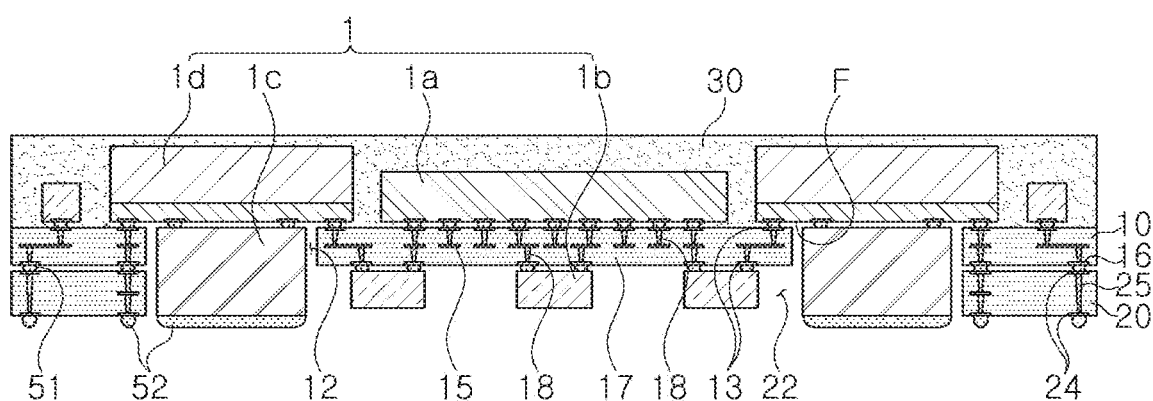
FIG. 2 illustrates a cross-sectional view of the electronic component module illustrated in FIG. 1.
Figure 3:
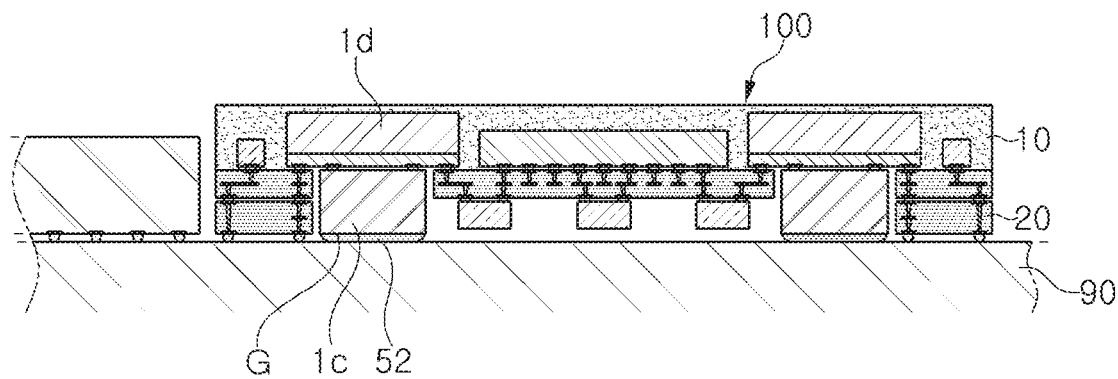
FIG. 3 illustrates a cross-sectional view of the electronic component module illustrated in FIG. 1 mounted on a main board.

FIG. 1 illustrates a perspective view of a partially cutaway electronic component module, in accordance with one or more embodiments, and FIG. 2 illustrates a cross-sectional view of the electronic component module illustrated in FIG. 1, while FIG. 3 illustrates a cross-sectional view of the electronic component module illustrated in FIG. 1 mounted on a main board.

Referring to FIGS. 1 to 3, an electronic component module 100 according to an example may include an electronic component 1, a first board 10, a second board 20 and a sealing portion 30.

The electronic component 1 may include various components such as passive components and active components. Any components which can be mounted on a board may be used as the electronic component 1.

The electronic component 1 may include at least one first component 1$a$ mounted on a first surface (top surface) of the first board 10, a second component 1$b$ mounted on a second surface (bottom surface) of the first board 10, and a third component 1$c$ disposed in a component insertion portion.

Additionally, in an example, the electronic component 1 may include at least one heat-generating component 1$d$. The heat-generating component 1$d$, among electronic components 1, is a component generating a large amount of heat while operating and may be mounted on the first or second surface of the first board 10. Accordingly, the heat-generating component 1$d$ may be configured to include at least one of the first component 1$a$ and the second component 1$b$.

In an example, the heat-generating component 1$d$ may be mounted on the first surface of the first board 10, and one surface ("F" of FIG. 2, hereinafter, "active surface") of the heat-generating component 1$d$ mounted on the first board 10 may be formed to have a larger surface area than a surface area of the component insertion portion 12. In this regard, when the heat-generating component 1$d$ is mounted on the first board 10, a portion of the active surface of the heat-generating component 1$d$ may be exposed through the component insertion portion 12. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The third component 1$c$, which will later be described, may be disposed to be in contact with the active surface of the heat-generating component 1$d$ exposed through the component insertion portion 12. Accordingly, the active surface of the heat-generating component 1$d$ exposed through the component insertion portion 12 may be provided with a connection pad on which the third component 1$c$ can be mounted.

The third component 1$c$ may not be mounted on the first board 10, but may be mounted on the active surface of the heat-generating component 1$d$ while passing through the component insertion portion 12, and thus may be electrically connected to the first board 10 through the connection pad, wiring, or the like.

In an example, the third component 1$c$ may be disposed to not be in contact with the first board 10, but is not limited thereto. At least a portion of the third component 1$c$ may be disposed to be in contact with the first board 10.

In an example, the third component 1$c$ may be configured as a radiating component for the external radiation of heat generated in the heat-generating component 1$d$. Accordingly, the third component 1c may be formed of a material having high thermal conductivity such as a metal.

In an example, the third component 1c may be formed in a metal block shape and may be formed of aluminum, but is not limited thereto. The third component 1c is subject to various modifications, including use of a material, beside a metal, having high thermal conductivity, formation thereof in the shape of a heat sink including a cooling pin, or the like.

Additionally, the third component 1c may be in contact with a main board 90 (FIG. 3) on which the electronic component module 100 is mounted. Referring to FIG. 3, the inactive surface ("G" of FIG. 3) of the third component 1c contacts the main board 90 through a second connection conductor 52. Accordingly, the third component 1c of the example, may have a mounting height that is the same as, or similar to, an overall thickness of the first board 10 and the second board 20.

On the basis of such a configuration, heat delivered from the heat-generating component 1d to the third component 1c may be released to the main board 90 through the second connection conductor 52.

The first board 10 may be a multilayer board formed to have a plurality of insulating layers 17 and a plurality of wiring layers 15, which are repeatedly stacked. If necessary, however, the first board 10 may be a double-sided board, in which the wiring layers 15 are formed on both surfaces of a single insulating layer 17.

A material of the insulating layer 17 is not particularly limited, but may be, for example, a thermosetting resin such as an epoxy resin, a thermoplastic resin such as polyimide, or a resin in which the thermosetting or thermoplastic resin is impregnated with an inorganic filler in a core material such as a glass fiber (or a glass cloth or a glass fabric), or the like, for example, an insulating material such as prepreg, Ajinomoto Build-up Film (ABF), FR-4, and Bismaleimide Triazine (BT).

The wiring layers 15 may electrically connect the electronic components 1 with each other, which will later be described, and may connect the electronic components 1 with the second board 20.

As a material of the wiring layers 15, a conductive material such as copper (Cu), aluminum (Al), silver (Ag), tin (Sn), gold (Au), nickel (Ni), lead (Pb), titanium (Ti), alloys thereof, or the like may be used, but is not limited thereto.

Interlayer-connecting conductors 18 may be disposed inside the insulating layer 17 for the interconnection of the laminatedly disposed wiring layers 15.

An insulation-protecting layer (not illustrated) may be disposed on a surface of the first board 10. The insulation-protecting layer is formed to cover all of the insulating layer 17 and the wiring layers 15 on the top surface and the bottom surface of the insulating layer 17. Accordingly, the insulation-protecting layer protects the wiring layer 15 disposed on the top or bottom surface of the insulating layer 17.

An electronic component 1 may be mounted on both surfaces of the first board 10. To this end, mounting electrodes 13 for mounting the electronic component 1 or, although not illustrated, wiring patterns electrically interconnecting the mounting electrodes 13 may be formed on both surfaces of the first board 10. Various types of boards may be implemented, for example, but not limited to, a ceramic board, a printed-circuit board, a flexible board, may be used for the first board 10.

An external connection pad 16 may be disposed on a second surface of the first board 10. The external connection pad 16 is provided to be electrically connected to the second board 20, which will later be described, and may be connected to the second board 20 through the first connection conductor 51.

Accordingly, the external connection pad 16 may be disposed in a position opposing the second board 20 when the second board 20 binds to the first board 10, on a lower surface of the first board 10, and a plurality of the external connection pads may be disposed in various forms.

The first board 10 according to an example may include at least one component insertion portion 12.

The component insertion portion 12 is prepared as a space in which the third component 1c is inserted. In the example, the third component 1c is mounted on the active surface of the heat-generating component 1d while passing through the component insertion portion 12. Accordingly, the component insertion portion 12 is formed in the shape of a through-hole large enough for the third component 1c can pass through.

The component insertion portion 12 is disposed in a region opposing a component accommodating portion 22 of the second board 20, which will later be described. Accordingly, at least a portion of the third component 1c inserted into the component insertion portion 12 is disposed inside the component accommodating portion 22.

The second board 20 binds to the second surface of the first board 10, and may be electrically connected to the first board 10 through the first connection conductor 51. The first connection conductor 51 may be provided as a conductive adhesive such as a solder or a conductive resin, but is not limited thereto.

The second board 20 may be formed in a manner similar to the first board 10. Various types of boards may be implemented, for example, a ceramic board, a printed-circuit board, a flexible board, and the like, may be used as the second board 20.

The second board 20 according to an example may be a multilayer board formed to have a plurality of layers, and a wiring pattern may be formed for formation of an electrical connection between respective layers.

An electrode pad 24 may be formed on both surfaces of the second board 20. The electrode pad 24, formed on a top surface of the second board 20, may be provided to be electrically connected to the external connection pad 16 of the first board 10. Further, an electrode pad 24, formed on a lower surface of the second board 20, may be connected to the second connection conductor 52.

Additionally, the second board 20 may include a conductive via 25 electrically connecting circuit patterns, formed inside the second board 20, to each other.

The component accommodating portion 22 may be used as a space in which the second components 1b mounted on the second surface of the first board 10, and the third components 1c are accommodated. Accordingly, the second components 1b and the third components 1c may only be mounted on a position opposing the component accommodating portion 22 of the second board 20.

In an example, the second board 20 may be formed to be a single board, and a component accommodating portion 22 is formed in a through-hole shape inside the second board 20, but is not limited thereto. The second board 20 may be configured with multiple boards spaced apart from each other.

Further, a mounting height of the second board 20 according to an example may be formed to be larger than a mounting height of the second component 1b. The mounting height refers to a height measured perpendicularly from a surface (for example, a second surface) of the first board 10.

A second connection conductor 52 may be disposed on an electrode pad 24 disposed in a lower portion, or a lower surface, of the second board 20. The second connection conductor 52, similar to the first connection conductor 51, may be formed of a conductive adhesive such as a solder or a conductive resin, but is not limited thereto.

The second connection conductor 52 may be used as an external connection terminal. Accordingly, the first board 10 may be electrically connected to the main board 90 (FIG. 3) on which the electronic component module 100 is mounted via the first connection conductor 51, the second board 20, and the second connection conductor 52.

A sealing portion 30 (FIG. 2) may be formed on the first surface of the first board 10, and seals the first components 1a mounted on the first surface of the first board 10.

The sealing portion 30 may be filled between the electronic components 1 mounted on the first board 10 so as to prevent the occurrence of electric shorts between the electronic components 1. Further, the sealing portion 30 fixes the electronic component 1 to the board while surrounding an outside of the electronic components 1, to safely protect the electronic components 1 from an external impact.

Such sealing portion 30 may be formed of an insulating material containing a resin material such as an epoxy.

The sealing portion 30 may be formed by placing the first board 10 on which the electronic components 1 are mounted on a mold (not illustrated) followed by injecting a molding resin into the mold, but is not limited thereto.

In the electronic component module 100 according to an example described above, the electronic components 1 are mounted on both sides of the first board 10. Further, the electronic component module 100 is electrically connected to an external source through the second board 20 disposed on a lower surface of the first board 10.

Accordingly, as a plurality of the electronic components 1 can be mounted on a single board (that is, the first board), a degree of integration of components may be increased. Further, an input/output path of the first board 10 on which the electronic components 1 are mounted may be formed through the second board 20, a separate board, and thus, an electrical connection to an external source may be easily achieved even when the electronic components 1 are mounted on both surfaces of the first board 10.

Additionally, the third component 1c may be mounted directly on the active surface of the heat-generating component 1d mounted on the first surface of the first board 10, heat generated from the heat-generating component 1d can be rapidly released externally.

Typically, heat generated from the heat-generating component 1d is only delivered to the main board through the first and second boards, thereby making effective release of heat difficult.

In an example, however, the heat of the heat-generating component 1d is delivered directly to the main board 90 through the third component 1c, thereby providing a short path for heat delivery. Accordingly, a first heat delivery path consisting of the first and second boards 10 and 20, and a second heat delivery path consisting of the third component 1c, may be implemented. Accordingly, heat is distributed through a plurality of heat delivery paths, which gives rise to effective heat release.

Hereinbelow, a method for manufacturing an electronic component module according to an example will be described.

FIGS. 4 to 8 are cross-sectional views describing a method for manufacturing the electronic component module illustrated in FIG. 1.

Figure 4:
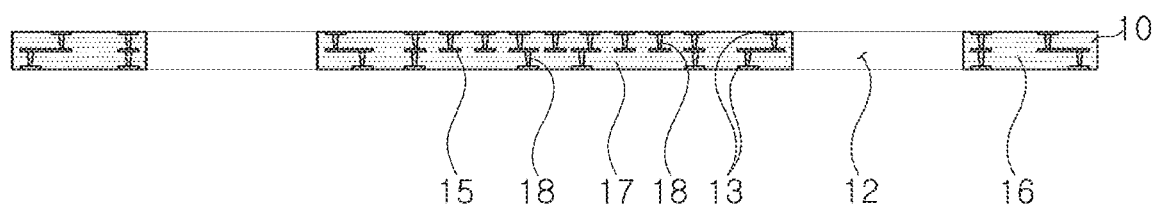
FIGS. 4 to 8 illustrate cross-sectional views describing a method for manufacturing the electronic component module illustrated in FIG. 1.

As illustrated in FIG. 4, the preparation of a first board 10 is carried out. As previously described, in an example, the first board 10 may be a multilayer board, and mounting electrodes 13 may be formed on both surfaces of the first board 10. Further, an external connection pad 16 may be formed on a bottom surface of the first board 10.

In an example, the first board 10 may be provided with at least one component insertion portion 12. The component insertion portion 12 may be formed in a through-hole shape.

Figure 5:
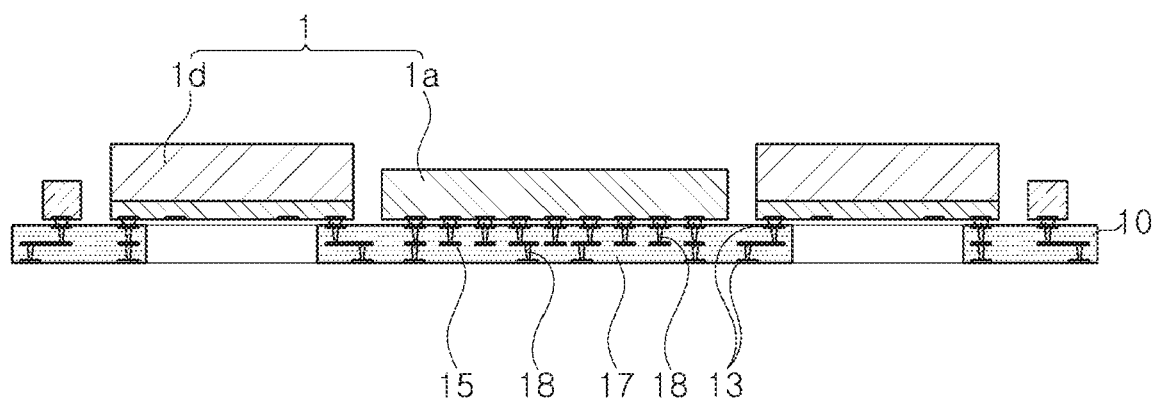

As illustrated in FIG. 5, the mounting of first components 1a and at least one heat-generating component 1d on a first surface of the first boar 10 is carried out. The mounting of the components may be achieved by printing a solder paste on a mounting electrode 13 formed on one surface of the first board 10 using a screen-printing method and placing the electronic components 1a there-above followed by applying heat thereto to harden the solder paste.

Figure 6:
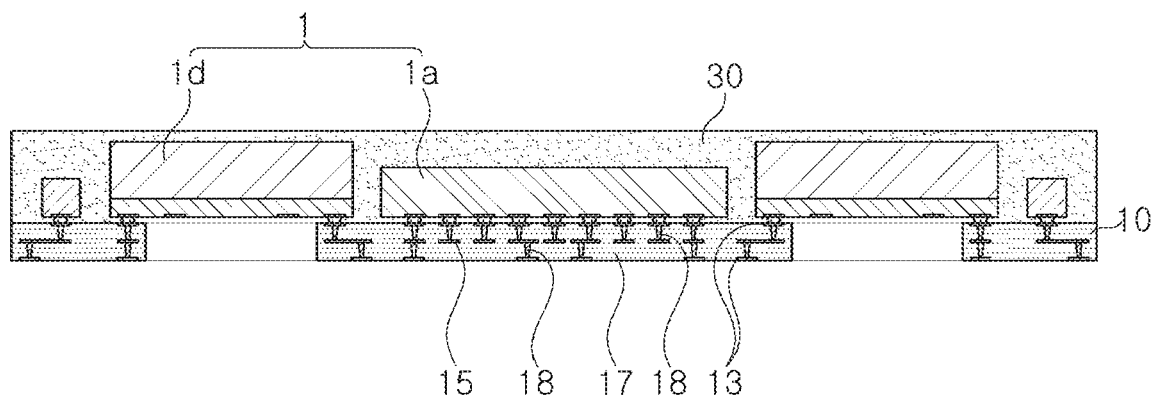

As illustrated in FIG. 6, a sealing portion 30 may be formed on the first surface of the first board 10 by sealing the first components 1a and the heat-generating component 1d. To this end, the first board 10, on which the first component 1a and the heat-generating component 1d are mounted, may be disposed in a mold, followed by injecting a molding resin into the mold.

Figure 7:
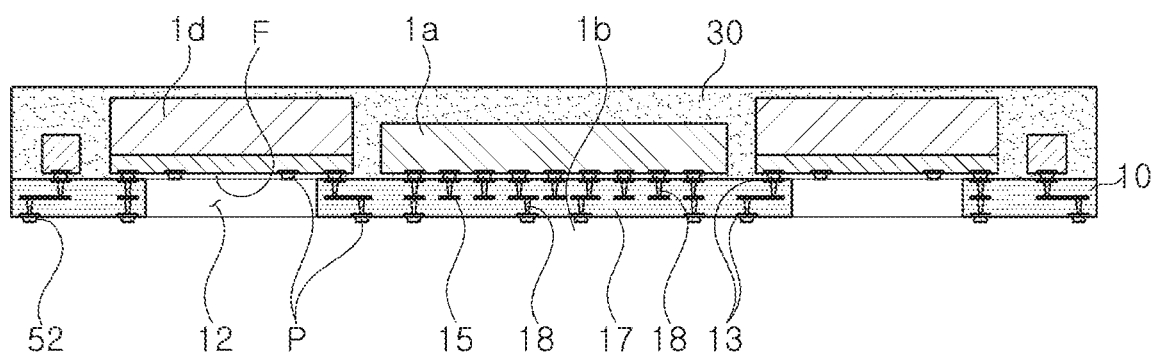

As illustrated in FIG. 7, the solder paste P is printed on the mounting electrode 13.

During the solder paste printing, the solder paste P is printed on each of the active surface F of the heat-generating component 1d and the second surface of the first board 10. The active surface of the heat-generating component 1d and the second surface of the first board 10 are disposed on different planes. In this regard, the solder paste P may be sequentially printed more than two times.

The printing of the solder paste P may include a first printing involving printing the solder paste P on the active surface of the heat-generating component 1d exposed through the component insertion portion 12, and a second printing involving printing the solder paste P on the second surface of the first board 10.

If necessary, the first printing and the second printing may be carried out in reverse order. If the solder paste P can be simultaneously printed on the active surface of the heat-generating component 1d and the second surface of the first board 10, the printing may be performed only once.

Figure 8:
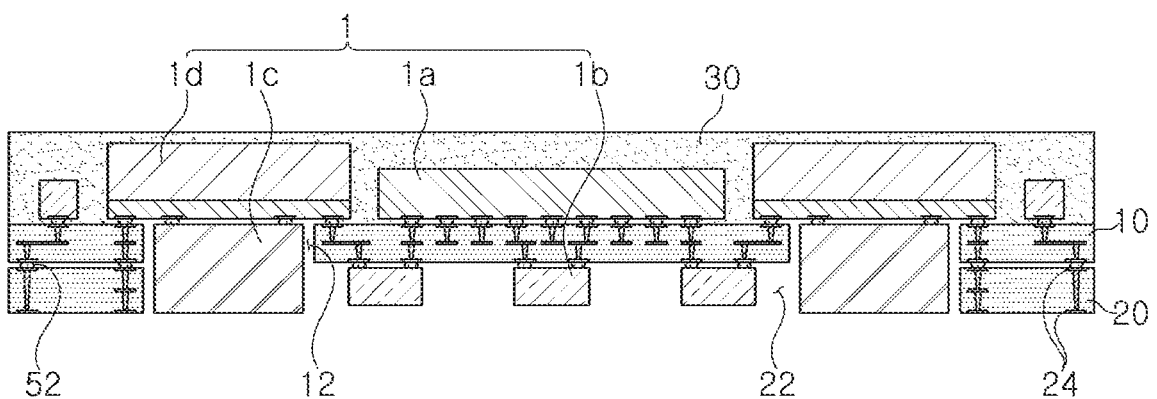

Once the printing of the solder paste P is completed, the second board 20 and the electronic components 1, as illustrated in FIG. 8, may be disposed on the second surface of the first board 10 on which the sealing portion 30 is formed. The third components 1c may then be disposed on the active surface of the heat-generating component 1d. The solder paste P is then melted and cured through a reflow process to bond the electronic components 1 and the second board, and the third components 1c to the first board 10 and the heat-generating component 1d, respectively.

The electronic component module 100 illustrated in FIG. 2 is prepared by forming a second connection conductor 52 on a lower surface of the second board 20 and an inactive surface of the third component 1c.

During the preparation of the electronic component module 100, the second connection conductor 52 may be formed on an electronic pad 24 of the second board 20 and the inactive surface of the third component through a conductive adhesive such as solder.

In the example of the third component 1c, the second connection conductor 52 may be formed on the entire inactive surface, but is not limited thereto. If necessary, the second connection conductor 52 may be formed on a portion of the inactive surface.

Meanwhile, in an example, the second board 20 and the second component 1b may be simultaneously mounted on the first board 10, but the example is not limited thereto. For example, the second board 20 and the second component 1b may be mounted on the first board 10 in order or in a reverse order. Accordingly, various modifications are feasible.

Further, in an example, the second board 20 may be mounted on the first board 10, and the second connection conductor 52 may be formed thereon. However, various modifications are feasible; for example, the second connection conductor 52 may be formed on the second board 20 in advance, followed by mounting the second board 20 on the first board 10.

The prepared electronic component module 100 according to an example may employ a first board 10 provided with a component insertion portion 12, but is not limited thereto. A first board 10 may be first prepared without a component insertion portion 12 followed by the forming of a component insertion portion 12 with a laser during the manufacturing of the electronic component module 100.

Meanwhile, the present disclosure is not limited to the previously described examples, and is subject to various modifications.

Figure 9:
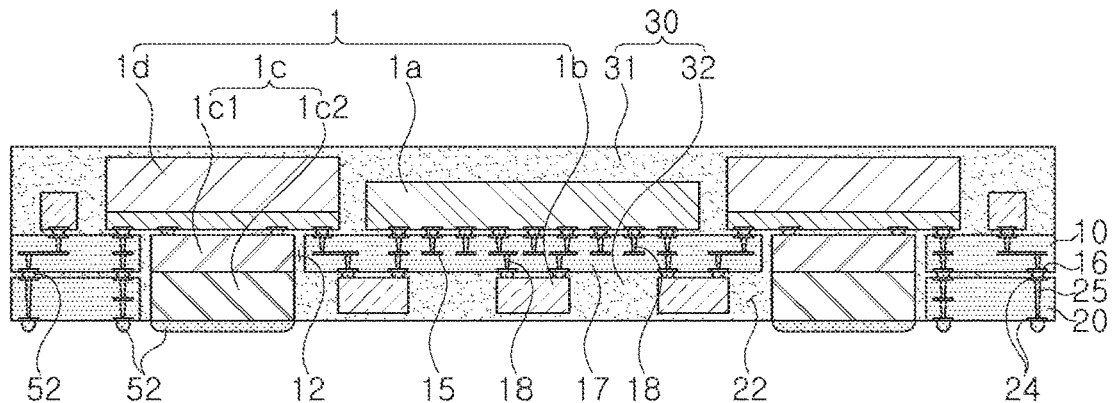
FIG. 9 illustrates a cross-sectional view of an electronic component module, in accordance with one or more embodiments.

FIG. 9 is a cross-sectional view of an electronic component module according to an example.

Referring to FIG. 9, an electronic component module 200 according to an example includes a third component 1c including a component portion 1c1 and a radiating portion 1c2.

The component portion 1c1 may be an electronic component and may be formed of at least one of general electronic components such as a passive component and an active component. The component portion 1c1 is bonded to an active surface of the heat-generating component 1d to be electrically connected to the first board 10 through the heat-generating component 1d.

A radiating portion 1c2 is bonded to an inactive surface of the component portion 1c1, and releases heat delivered from the component portion 1c1 to a main board (90 of FIG. 3). Similar to the third component 1c of the previous example, the radiating portion 1c2 may be formed in the shape of a metal block having high thermal conductivity, but is not limited thereto.

Referring to FIG. 9, the electronic component module 200 includes a component accommodating portion 22 in which a sealing portion 30 is disposed. Accordingly, the sealing portion 30 may be divided into a first sealing portion 31, disposed on a first surface of a first board 10, and a second sealing portion 32, disposed on a second surface of the first board 10.

The second sealing portion 32 is disposed in the form of filling the entirety of the component accommodating portion 22. Accordingly, all electronic components 1 accommodated in the component accommodating portion 22 may be embedded in the second sealing portion 32. An inactive surface of a third component 1c may be exposed to an exterior of the second sealing portion 32, but is not limited thereto. If necessary, at least a portion of the electronic components 1 may be configured to be exposed to an exterior of the second sealing portion 32.

Similar to the first sealing portion 31, the second sealing portion 32 may be formed by a molding method involving an injection of a molding resin, but is not limited thereto. Various modifications are feasible. For example, a liquid resin solution may be injected in a component accommodating portion 22, and cured to form the second sealing portion 32.

Figure 10:
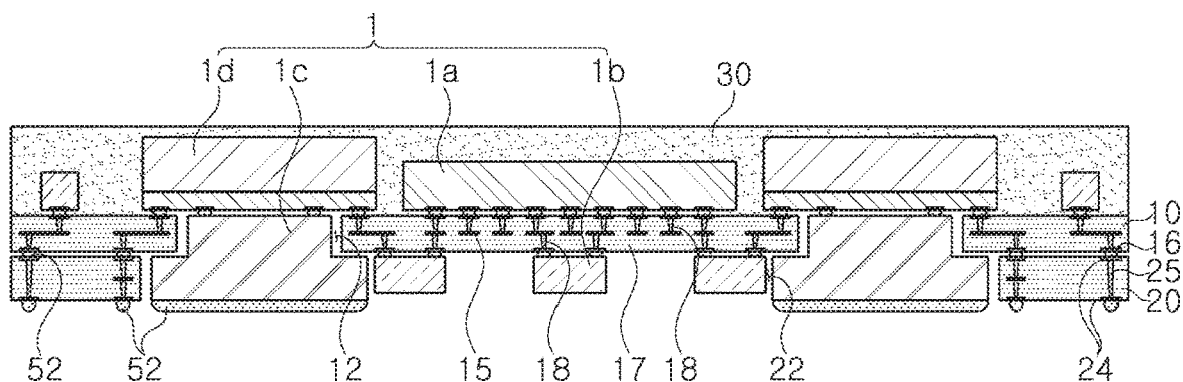
FIG. 10 is a cross-sectional view schematically illustrating an electronic component module, in accordance with one or more embodiments.

FIG. 10 is a cross-sectional view schematically illustrating an electronic component module according to an example.

Referring to FIG. 10, an electronic component module 300 according to an example may have a cross section that increases as a third component 1c moves away from a first board 10 in a direction that is transverse to the second surface of the first board 10. Accordingly, the third component 1c may be configured to have an inactive surface having a larger surface area.

In an example, a cross-sectional area of the third component 1c is increased by a step, but is not limited thereto. Various modifications are feasible. For example, the third component 1c may be configured to have a cross-sectional area, that gradually increases in a direction toward the inactive surface.

The third component 1c having such a configuration may have an increased contact surface area, which is in contact with a main board (90 of FIG. 3). In this regard, the third component 1c can more rapidly deliver heat received from the heat-generating component 1d to the main board 90.

Figure 11:
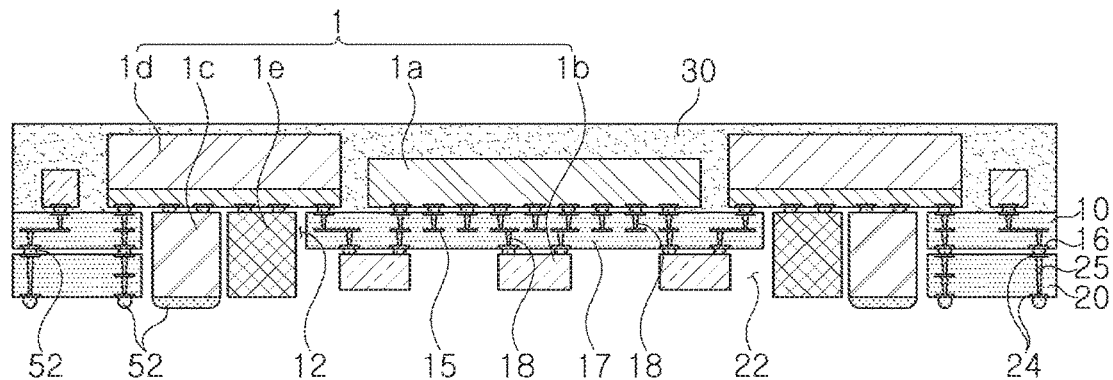
FIG. 11 is a cross-sectional view schematically illustrating an electronic component module, in accordance with one or more embodiments.

FIG. 11 is a cross-sectional view schematically illustrating an electronic component module according to an example.

Referring to FIG. 11, an electronic component module 400 according to an example may include at least a fourth component 1e.

The fourth component 1e is an electronic component, a mounting height of which is larger than a thickness of a second board 20, and is inserted into a component insertion portion 12 along with a third component 1c to be mounted on an active surface of a heat-generating component 1d. The mounting height refers to a vertical distance from the active surface of the heat-generating component 1d to a top surface of the fourth component 1e.

The third component 1c of the example may be configured to be the same as the third component 1c of FIG. 2 or FIG. 9, and may be configured to be different only in terms of size if necessary. Accordingly, a detailed description of the third component 1c will be omitted.

The fourth component 1e may have a larger mounting height compared to a thickness of the second board 20, thereby making it difficult to be mounted on the second surface of the first board 10. Further, in the example of being mounted on the first surface of the first board 10, an overall thickness of the electronic component module may increase to be equal to a size of the fourth component 1e.

When the fourth component 1e is inserted into the component insertion portion 12 to be mounted on the active surface of the heat-generating component 1d as in the example, however, the thickness of the electronic component module does not increase due to the fourth component 1e. Accordingly, the electronic component module according to the example can remain thin even when an electronic component having a large mounting height is included.

The electronic component module according to the examples can directly radiate heat generated in a heat-generating component to a direct board using a radiating component and can thus increase heat radiation efficiency.

Further, even when an electronic component having a large mounting height is included, a thickness of the electronic component can be minimized.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component module, comprising:
    a first board comprising a component insertion portion;
    at least one heat-generating component and at least one first electronic component mounted on a first surface of the first board;
    a radiating component inserted into the component insertion portion, and mounted on an active surface of the heat-generating component;
    a second board, and at least one second electronic component, mounted on a second surface of the first board, and configured to electrically connect the first board to an external source; and
    a connection conductor disposed on an inactive surface of the radiating component, and configured to allow contact between the inactive surface of the radiating component and a main board.

2. The electronic component of claim 1, wherein at least a portion of the active surface of the heat generating component is exposed through the component insertion portion.

3. The electronic component module of claim 1, wherein the component insertion portion is formed in the shape of a through-hole.

4. The electronic component module of claim 1, wherein the radiating component is formed of a metal block.

5. The electronic component module of claim 1, wherein the radiating component comprises a component portion in contact with the active surface of the heat-generating component, and a radiating portion bound to an inactive surface of the component portion.

6. The electronic component module of claim 5, wherein the second board comprises a component accommodating portion having a through-hole shape, and
    the component portion is disposed inside the component accommodating portion.

7. The electronic component module of claim 6, wherein at least a portion of the radiating component is disposed inside the component accommodating portion.

8. The electronic component module of claim 1, wherein a mounting height of the radiating component is formed to be equal to an overall height of the first board and the second board.

9. The electronic component module of claim 1, wherein the radiating component has a cross section that increases in a direction that is transverse to the first board.

10. The electronic component module of claim 1, wherein the connection conductor is formed of one of solder and a conductive resin.

11. The electronic component module of claim 1, wherein the connection conductor is disposed on the entirety of the inactive surface of the radiating component.

12. The electronic component module of claim 1, further comprising an electronic component inserted into the component insertion portion, and mounted on the active surface of the heat-generating component.

13. The electronic component module of claim 12, wherein a mounting height of the electronic component is higher than a thickness of the second board.

14. A method of manufacturing an electronic component module, the method comprising:
    preparing a first board comprising a component insertion portion;
    mounting at least one heat-generating component and at least one first electronic component on a first surface of the first board;
    inserting a radiating component into the component insertion portion;
    disposing at least one second electronic component and a second board on a second surface of the first board; and
    disposing a connection conductor on an inactive surface of the radiating component.

15. The method of claim 14, wherein in the mounting of the at least one heat-generating component, at least a portion of an active surface of the heat-generating component is exposed through the component insertion portion.

16. The method of claim 14, further comprising forming a sealing portion that seals the heat-generating component on the first surface of the first board.

* * * * *